(12) United States Patent
Ko

(10) Patent No.: US 7,579,230 B2
(45) Date of Patent: Aug. 25, 2009

(54) HIGH VOLTAGE BICMOS DEVICE AND METHOD FOR MANUFACTURING THE SAME

(75) Inventor: Kwang Young Ko, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 25 days.

(21) Appl. No.: 11/644,202

(22) Filed: Dec. 21, 2006

(65) Prior Publication Data

US 2007/0145532 A1    Jun. 28, 2007

(30) Foreign Application Priority Data

Dec. 28, 2005    (KR) ............... 10-2005-0132659

(51) Int. Cl.
*H01L 21/8238* (2006.01)

(52) U.S. Cl. ............ 438/202; 438/309; 438/341; 257/E27.109

(58) Field of Classification Search ......... 438/309–342, 438/202–205; 257/E27.109

See application file for complete search history.

(56) References Cited

U.S. PATENT DOCUMENTS

| 4,290,831 A | * | 9/1981 | Ports et al. | ............... 438/404 |
| 4,624,047 A | * | 11/1986 | Tani | .......................... 438/404 |
| 4,979,010 A | * | 12/1990 | Brighton | ................... 257/518 |

* cited by examiner

*Primary Examiner*—H. Jey Tsai
(74) *Attorney, Agent, or Firm*—The Law Offices of Andrew D. Fortney; Andrew D. Fortney; Duangkamol Kay Strohl

(57) ABSTRACT

A high voltage BICMOS device and a method for manufacturing the same, which may improve the reliability of the device by securing a distance between adjacent DUF regions, are provided. The high voltage BICMOS device includes: a reverse diffusion under field (DUF) region formed by patterning a predetermined region of a semiconductor substrate; a diffusion under field (DUF) region formed in the substrate adjacent to the reverse DUF region; a spacer formed at a sidewall of the reverse DUF region; an epitaxial layer formed on an entire surface of the substrate; and a well region formed in contact with the DUF region.

18 Claims, 4 Drawing Sheets

HIGH VOLTAGE BICMOS DEVICE AND METHOD FOR MANUFACTURING THE SAME

BACKGROUND OF THE INVENTION

1. Field of the Invention

The present invention relates to a high voltage BICMOS device and a method for manufacturing the same.

2. Description of the Related Art

In general, in order to reduce a collector resistance of a bipolar transistor and to suppress a parasitic capacitance of a BICMOS transistor, a diffusion under field (referred to as 'DUF' hereinafter) region is formed. Typically, the DUF region may be characterized as a buried layer.

FIGS. 1 through 3 are cross-sectional views of a high voltage BICMOS device of a semiconductor device according to the related art for sequentially describing a method for manufacturing the BICMOS device.

First, as shown in FIG. 1, a pad oxide layer 12 is formed on a semiconductor substrate 10. Further, so as to expose the DUF region of the semiconductor substrate 10, a photoresist pattern 14 is formed in a predetermined region of the pad oxide layer 12.

Next, using the photoresist pattern 14 as a mask, a predetermined depth of the semiconductor substrate 10 and the pad oxide layer 12 are etched to define a formation region 15 for the DUF region.

Next, as shown in FIG. 2, ions are implanted in an entire surface of the semiconductor substrate 10 on which the formation region 15 of the DUF region is formed in order to implant the ions in the region 15. A diffusion process is performed to diffuse the implanted ions to form the DUF region 16. Next, the photoresist pattern 14 is removed.

Finally, as shown in FIG. 3, the pad oxide layer 12 is removed. A selective epitaxial growth (SEG) process is carried out on the resulting structure, including the DUF region 16, to form an epitaxial layer 18 on the DUF region 16 and the substrate 10. Next, a photoresist pattern (not shown) for forming a high voltage well region is formed on the epitaxial layer 18. After ions have been implanted in the epitaxial layer 18 using the photoresist pattern as a mask, a diffusion process is performed therein to form a high voltage well region 20 in contact with the DUF region 16.

However, in the related art, the DUF region 16 formed by the diffusion process after the ion implantation diffuses the DUF region 16 in a longitudinal direction and a transverse direction. That is, the DUF region 16 is diffused by a width or distance A (FIG. 2) from the original formation region 15, and is further diffused by a width or distance B (FIG. 3) during formation of the epitaxial layer 18 and the high voltage well region 20.

Accordingly, a distance between adjacent DUF regions 16 becomes narrower, thereby leading to possible deterioration of the reliability of the device.

SUMMARY OF THE INVENTION

Accordingly, the present invention is directed to a semiconductor device and a method for manufacturing the same that substantially obviates one or more problems due to limitations and disadvantages of the related art.

An object of the present invention is to provide a high voltage BICMOS device and a method for manufacturing the same, which may improve the reliability of the device by securing or ensuring a minimum distance between adjacent DUF regions.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a semiconductor device (e.g., a high voltage BICMOS device) comprising: a reverse diffusion under field (DUF) region in a semiconductor substrate (e.g., formed by patterning a predetermined region of the substrate); a diffusion under field (DUF) region in the substrate adjacent to the reverse diffusion under field region; a spacer at a sidewall of the reverse diffusion under field region; an epitaxial layer on an entire (exposed) surface of the substrate having the spacer thereon; and a well region in contact with the diffusion under field region.

In another aspect of the present invention, there is provided a method for manufacturing a semiconductor device (e.g., a high voltage BICMOS device) comprising: patterning a predetermined region of a semiconductor substrate to form a reverse diffusion under field region; forming a diffusion under field (DUF) region in the substrate adjacent to the reverse diffusion under field region; forming a spacer at a sidewall of the reverse diffusion under field region; forming an epitaxial layer on an entire (exposed) surface of the substrate having the spacer thereon; and forming a well region adjacent to the diffusion under field region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a high voltage BICMOS device and a method for manufacturing the same according to an embodiment of the present invention will be explained with reference to the accompanying drawings.

In the description of an embodiment of the present invention, when something is formed "on" a layer or structure, the "on" includes forming the thing "directly on," "indirectly on," and/or "over" the underlying layer or structure.

FIGS. 4 through 8 are cross-sectional views of a high voltage BICMOS device of a semiconductor device according to an embodiment of the present invention, useful for describing an exemplary method for manufacturing the BICMOS device.

Figure 1:
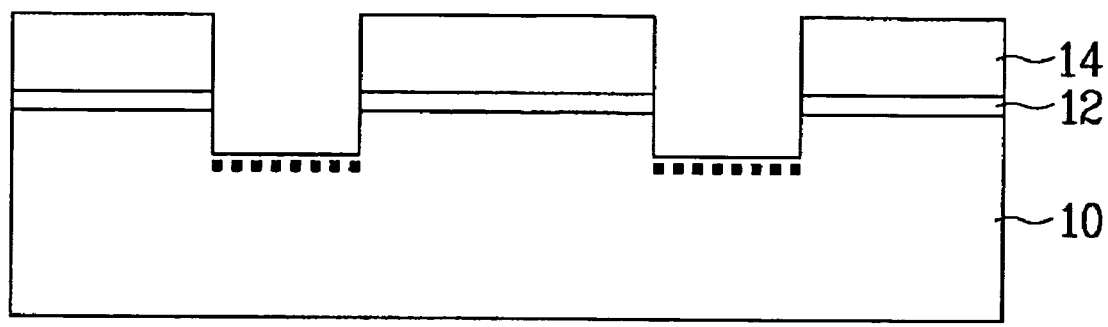
FIGS. 1 through 3 are cross-sectional views of a high voltage BICMOS device of a semiconductor device according to the related art for sequentially describing a method for manufacturing the BICMOS device.
Figure 2:
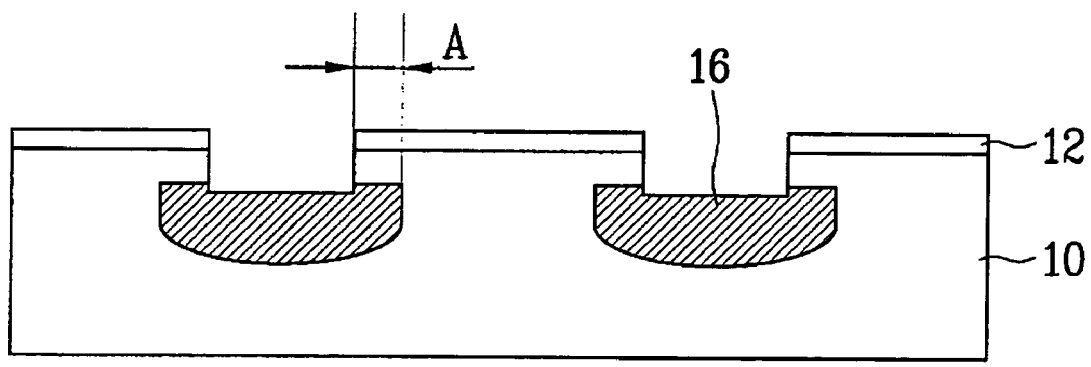
Figure 3:
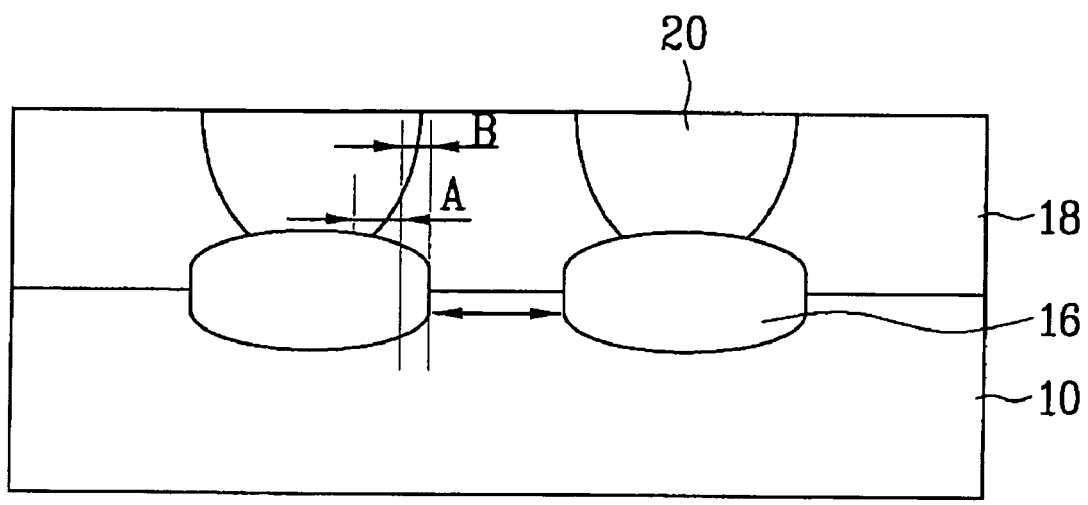
Figure 4:
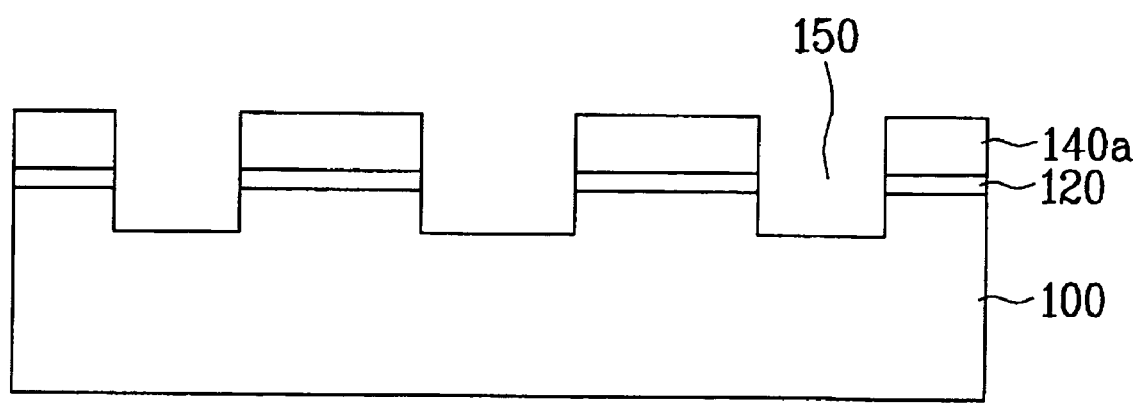
FIGS. 4 through 8 are cross-sectional views of a high voltage BICMOS device of a semiconductor device according to an embodiment of the present invention, useful for describing an exemplary method for manufacturing the BICMOS device.

First, as shown in FIG. 4, a pad oxide layer 120 is formed on a semiconductor substrate 100, and a first photoresist pattern 140a is formed on a predetermined region of the pad oxide layer 120 in order to form or define a reverse DUF region on the semiconductor substrate 100.

Next, using the first photoresist pattern 140a as a mask, the pad oxide layer 120 and a predetermined depth of the semiconductor substrate 100 are etched to create a trench that further defines the reverse DUF region 150.

Figure 5:
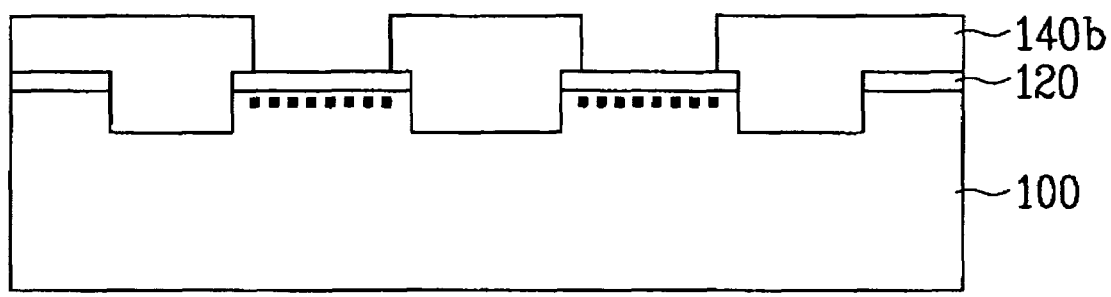

Then, as shown in FIG. 5, the first photoresist pattern 140a is removed, and a second photoresist pattern 140b covering the reverse DUF region is formed.

The first photoresist pattern 140a defines the reverse DUF region, and the second photoresist pattern 140b defines the DUF region.

Figure 6:
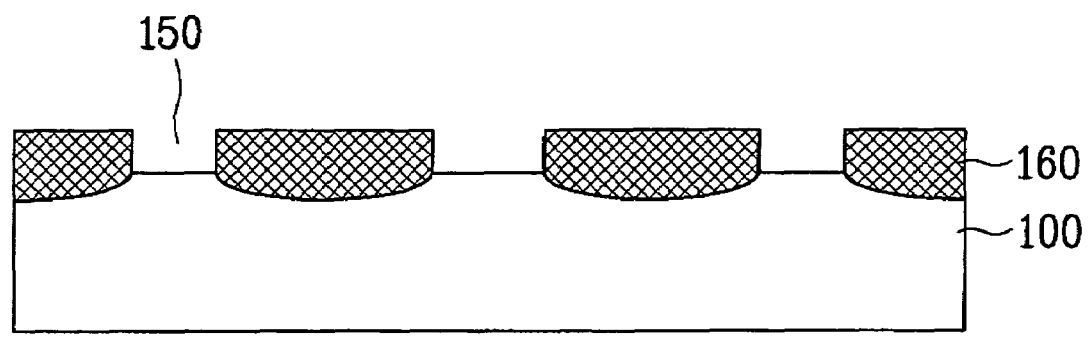

Thereafter, as shown in FIG. 6, an ion implantation process is carried out to implant dopant ions in the semiconductor substrate exposed by the second photoresist pattern 140b in the formation region of the DUF region. Subsequently, a diffusion process is performed to diffuse the implanted ions (e.g., by heating and/or annealing the substrate, typically at a temperature of from 600, 700 or 800 to 900, 1000 or 1100° C. for a length of time of from 10, 20 or 30 sec to 60, 120 or 300 sec if by rapid thermal annealing or from 20, 30 or 60 min. to 1, 2 or 4 hours if by furnace annealing), so that the DUF region 160 is formed. In addition, the dopant implanted into the DUF region 160 is activated by such annealing. Next, the second photoresist pattern 140b and the pad oxide layer 120 are removed, respectively.

Figure 7:
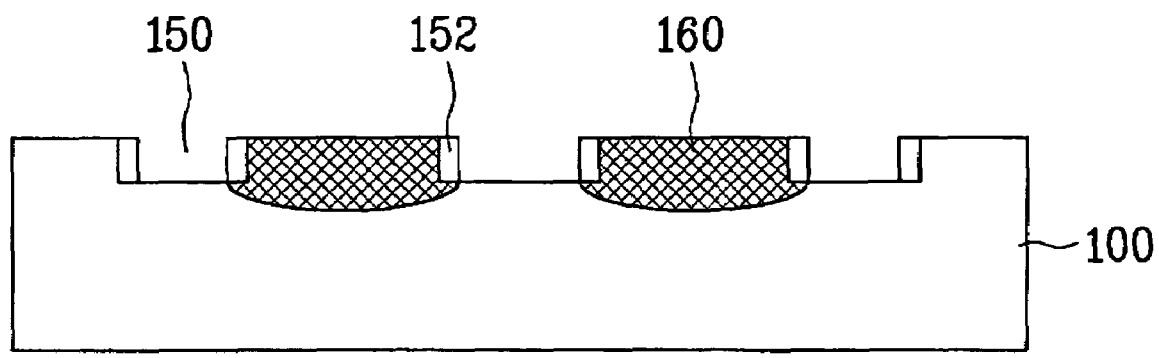

Subsequently, as shown in FIG. 7, an insulating layer is formed on the entire surface of a substrate on which the DUF region 160 is formed. Next, the insulating layer is (anisotropically) etched to form a spacer 152 at a sidewall of the reverse DUF region 150. The spacer 152 can comprise a nitride layer or an oxide layer, but an oxide layer (e.g., undoped silicon dioxide) is preferred.

Figure 8:
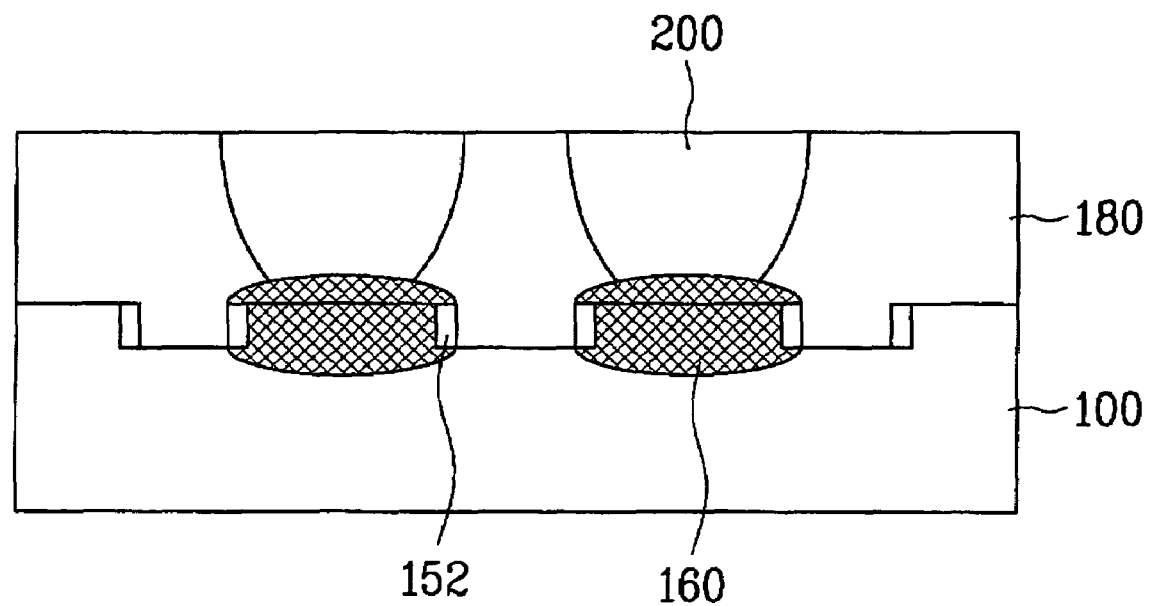

Finally, as shown in FIG. 8, a selective epitaxial growth (SEG) process is performed on the resulting structure on which the spacer 152 is formed to form an epitaxial layer 180 on the at an entire surface of the substrate on which the DUF region 160 is formed. Next, a photoresist pattern (not shown) for forming a high voltage well region is formed on the epitaxial layer 180. Then, after ions have been implanted in the epitaxial layer 180 using the mask, a diffusion process is performed therein (under conditions the same as or similar to those described above) to form a high voltage well region 200 in contact with the DUF region 160.

On the other hand, the reverse DUF region 150 and the spacer 152 formed at a sidewall thereof can prevent ions implanted in the DUF region 160 from being diffused into an adjacent region (e.g., the reverse DUF region 150). Accordingly, a distance between adjacent DUR regions 160 is secured and/or ensured.

In the present invention, since the reverse DUF region and the spacer formed at a sidewall thereof are formed inside the semiconductor substrate, adjacent to the DUF region, it can prevent ions implanted into the DUF region from being diffused into an adjacent region in order to secure a distance between adjacent DUF regions. This enhances the reliability of the device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a device comprising:
    patterning a predetermined region of a semiconductor substrate by etching a predetermined depth into the substrate to form a plurality of reverse diffusion under field regions and a plurality of raised portions, each of the reverse diffusion under field regions exposing a surface of the substrate;
    masking the reverse diffusion under field regions and forming a diffusion under field region in each of the plurality of raised portions adjacent to at least one of the reverse diffusion under field region;
    forming spacers on sidewalls of the diffusion under field regions and exposing a portion of the surface of the substrate in the reverse diffusion under field region;
    forming an epitaxial layer on an entire surface of the substrate, including the spacers; and
    forming a well region in the epitaxial layer over each of the diffusion under field regions.

2. The method according to claim 1, wherein forming the diffusion under field region includes:
    forming a photoresist pattern covering the reverse diffusion under field regions; and implanting ions in the substrate exposed by the photoresist pattern.

3. The method according to claim 2, wherein forming the diffusion under field region further includes diffusing the implanted ions.

4. The method according to claim 3, wherein forming the diffusion under field region further includes removing the photoresist pattern.

5. The method according to claim 1, wherein the well region comprises a high voltage well region.

6. The method according to claim 5, wherein forming the high voltage well region comprises performing an ion implantation process.

7. The method according to claim 1, wherein the spacer comprises an oxide layer or a nitride layer.

8. The method according to claim 1, wherein forming the reverse diffusion under field region comprises forming trenches in the substrate.

9. The method according to claim 1, wherein the well region is in contact with the diffusion under field region.

10. The method according to claim 1, wherein the epitaxial layer has a lowermost horizontal surface that is coplanar with a lowermost horizontal surface of the spacer.

11. A method for manufacturing a device comprising:
    patterning a first photoresist on a semiconductor substrate to define a plurality of diffusion under field regions;
    etching a plurality of trenches in exposed regions of the substrate;
    patterning a second photoresist to cover the trenches and expose the diffusion under field regions;
    implanting ions to form the plurality of diffusion under field regions;
    forming spacers on sidewalls of each of the plurality of diffusion under field regions and exposing a portion of the surface of the substrate in the reverse diffusion under field region;

forming an epitaxial layer on an entire surface of the substrate, including in the trenches and covering the spacers; and forming a well region in the epitaxial layer over each of the plurality of diffusion under field regions.

12. The method according to claim 11, wherein forming the diffusion under field region further includes diffusing the implanted ions.

13. The method according to claim 11, wherein forming the diffusion under field region further includes removing the first photoresist pattern.

14. The method according to claim 11, wherein forming the well region comprises performing an ion implantation process.

15. The method according to claim 11, wherein the spacer comprises an oxide layer.

16. The method according to claim 11, wherein the spacer comprises a nitride layer.

17. The method according to claim 11, wherein the well region is in contact with the diffusion under field region.

18. The method according to claim 11, wherein the epitaxial layer has a lowermost horizontal surface that is coplanar with a lowermost horizontal surface of the spacer.

* * * * *